United States Patent [19]

Shinohara

[11] Patent Number: 5,382,839

[45] Date of Patent: Jan. 17, 1995

[54] POWER SUPPLY CONTROL CIRCUIT FOR USE IN IC MEMORY CARD

[75] Inventor: Takayuki Shinohara, Itami, Japan

[73] Assignee: Mitsubishi Denki Kabushiki Kaisha, Tokyo, Japan

[21] Appl. No.: 121,189

[22] Filed: Sep. 15, 1993

[30] Foreign Application Priority Data

Sep. 16, 1992 [JP] Japan .................. 4-246675

[51] Int. Cl.⁶ .................. H02H 3/24; H02H 3/20
[52] U.S. Cl. .................. 327/545; 327/530; 327/546; 327/74
[58] Field of Search ............. 365/229; 307/296.1, 307/296.4, 360, 361, 362

[56] References Cited

U.S. PATENT DOCUMENTS

| | | | |
|---|---|---|---|
| 4,288,865 | 9/1981 | Graham | 302/296.4 |
| 4,428,020 | 1/1984 | Blanchard, Jr. | 302/296.4 |
| 4,451,742 | 5/1984 | Aswell | 365/229 |
| 4,639,681 | 1/1987 | Hasegawa | 302/360 |
| 4,907,183 | 3/1990 | Tanaka | 365/229 |
| 5,140,183 | 8/1992 | Takenaka | 302/296.4 |

Primary Examiner—Timothy P. Callahan
Assistant Examiner—Dinh Le

[57] ABSTRACT

An IC memory card used in a dual power supply voltage operation system and having a backup function is arranged to prevent destruction of data stored in an internal memory caused by an erroneous access in a non-operation-ensured voltage range between lower and higher operation-ensured voltage ranges. Three voltage levels divided from an external power supply voltage by voltage dividing resistors are compared with a reference voltage from a reference voltage generation circuit to determine whether the external power supply voltage is at the lower or upper limit of the lower operation-ensured voltage range or the lower limit of the higher operation-ensured voltage range. On the basis of outputs from these comparators, a memory protection signal generation circuit generates a memory protection signal to enable the memory to be protected even in the voltage range between the lower and higher operation-ensured voltage ranges.

5 Claims, 7 Drawing Sheets

POWER SUPPLY CONTROL CIRCUIT FOR USE IN IC MEMORY CARD

BACKGROUND OF THE INVENTION

1. Field of the Invention

This invention relates to a power supply control circuit for use in an IC memory card having a battery backup function.

2. Description of the Related Art

FIG. 10 is a block diagram of a power supply control circuit of a conventional IC memory card capable of battery backup. An external power supply voltage $V_{cc}$ from an external unit (not shown) applied between an external power supply voltage terminal 1 and a ground terminal 2 is divided by a pair of voltage dividing resistors 3a and 3b to be supplied to an inverting input terminal of a comparator 4 for detecting a memory protection voltage and is also divided by another pair of voltage dividing resistors 3c and 3d to be supplied to an inverting input terminal of a comparator 5 for detecting a power supply changing voltage. Reference voltages from a reference voltage generation circuit 6 are supplied to non-inverting input terminals of the comparators 4 and 5. A memory protection signal generation circuit 7 generates a memory protection signal according to an output from the comparator 4 and outputs the signal through its memory protection signal output terminal 8. A power supply changing PMOS transistor 9 is switched by an output from the comparator 5. A terminal 10 is an internal voltage output terminal and a terminal 11 is a backup battery connection terminal to which a backup battery (not shown) incorporated in the card is connected. A Schottky diode 12 for preventing a reverse current to the battery and a current limiting resistor 13 are provided. The internal voltage output terminal 10 and the memory protection signal output terminal 8 are connected to an internal circuit (not shown) including a memory device. Lines 1a and 10a represent an external power supply line and an internal power supply line, respectively. Each of the comparators 4 and 5 generates an outputs in accordance with the result of comparison between the reference voltage from the reference voltage generation circuit 6 and the detected voltage from the voltage dividing resistors 3a and 3b or 3c and 3d. Each of the comparators 4 and 5 has a hysteresis such that a voltage at which the output is inverted from a lower level to a high level is different from a voltage at which the output is inverted from the high level to the low level.

The operation of this control circuit will be described below. In a backup state, the power supply changing PMOS transistor 9 is off (non-conductive state) and the voltage of the battery connected to the battery connection terminal 11 is supplied through the diode 12 and the resistor 13 and output through the internal voltage output terminal 10 to back up the internal circuit. If the card is connected to the external unit to apply the external power supply voltage $V_{cc}$ and if the voltage $V_{cc}$ becomes equal to a power supply changing voltage $V_{s1}(+)$ in a voltage rising state, the output from the power supply changing voltage detection comparator 5 is inverted to turn on the transistor 9 (conductive state), whereby a voltage obtained by subtracting a drop voltage due to the on-resistance of the transistor 9 from the voltage applied to the external power supply voltage terminal 1 is output through the internal voltage output terminal 10. If a memory protection voltage $V_{s2}(+)$ at which the memory is to be released from the protected state is reached by a further increase in the voltage $V_{cc}$, the output from the memory protection voltage detection comparator 4 is inverted and the memory protection signal generation circuit 7 generates a signal to release the memory from the protected state. This signal is output through the memory protection signal output terminal 8 to change the internal circuit from a standby state into an accessible state.

Conversely, if the external power supply voltage $V_{cc}$ drops to a memory protection voltage $V_{s2}(-)$ at which memory protection is necessitated, the output from the comparator 4 is inverted and the memory protection signal generation circuit 7 generates the memory protection signal. This signal is output through the memory protection signal output terminal 8 to set the internal circuit in the standby state (protected state). If the voltage $V_{cc}$ further drops to a power supply changing voltage $V_{s1}(-)$ in a voltage dropping state, the output from the comparator 5 is inverted to turn off the transistor 9. The internal circuit is thereby set again to the state of being backed-up by the battery. The values of the power supply changing voltages $V_{s1}(+)$ and $V_{s1}(-)$ in the voltage rising state and the voltage dropping state are different from each other. Also, the memory protection voltages $V_{s2}(+)$ and $V_{s2}(-)$ in the voltage rising state and the voltage dropping state are different from each other.

If the thus-constructed conventional IC memory card power supply control circuit capable of battery backup is applied to a dual voltage operation system ensuring operation in two power supply voltage ranges at 3.3 V and 5 V (for example, the range of 3.3 V ±5% and the range of 5 V ±5%), it is difficult to protect the memory device in the internal circuit during a shifting period between 3.3 V and 5 V in which the operation is not ensured, because only one memory protection voltage can be set. There is therefore a possibility of destruction of data stored in the memory device when the power supply voltage is within such a voltage range.

SUMMARY OF THE INVENTION

Accordingly, an object of the present invention is to provide an IC memory card power supply control circuit capable of battery backup which, when applied to an application to a dual voltage operation system ensuring operation in two power supply voltage ranges at 3.3 V and 5 V, can set an internal memory card circuit in an operable state with respect to each of the two power supply voltage ranges and can protect a memory during a shifting period between 3.3 V and 5 V in which the operation is not ensured.

In order to achieve this object, according to one aspect of the present invention, there is provided an IC memory card power supply control circuit having power supply voltage detection means for detecting an external power supply voltage. The power supply voltage detection means has two voltage detection ranges corresponding to two power supply voltage ranges in which operation in a dual voltage operation system is ensured (operation-ensured ranges). An internal memory circuit is operable only when the voltage of the external power supply line is within either one of these ranges.

According to another aspect of the present invention, there is provided an IC memory card power supply control circuit further including operating range changing means for changing operating ranges in accordance with a single power supply voltage operation system using the higher or lower one of two operation-ensured voltage ranges, a dual power supply voltage operation system using the two operation-ensured voltage ranges, and a wide-range power supply voltage operation system having an operation-ensured voltage range covering the two operation-ensured voltage ranges by selectively making voltage levels detected by the power supply voltage detection means ineffective.

In the power supply control circuit in the first aspect of the invention, two voltage detection ranges corresponding to two operation-ensured ranges of a dual voltage operation system are provided to enable the internal circuit to be protected during a time period for a shift from the lower operation-ensured voltage range to the higher operation-ensured voltage range in the dual voltage operation system, in which the desired operation is not ensured.

In the power supply control circuit in the second aspect of the invention, operation range changing means capable of selectively making voltage levels detected by the power supply voltage detection means ineffective is provided to enable the memory card to be used in each of a single power supply voltage operation system using the higher or lower one of two operation-ensured voltage ranges, a dual power supply voltage operation system using the two operation-ensured voltage ranges, and a wide-range power supply voltage operation system having an operation-ensured voltage range covering the two operation-ensured voltage ranges.

DESCRIPTION OF THE PREFERRED EMBODIMENTS

Embodiments of the present invention will be described below with reference to the drawings.

[Embodiment 1]

Figure 1:
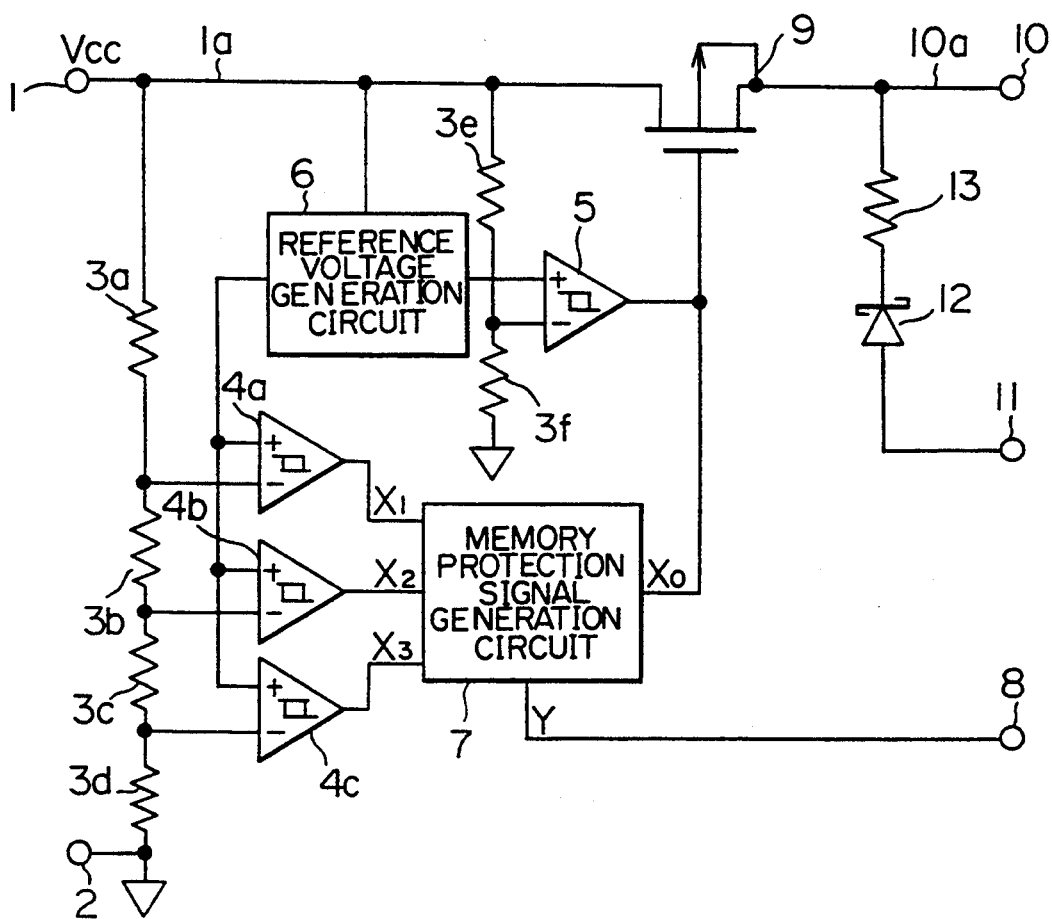
FIG. 1 is a diagram of an IC memory card power supply control circuit in accordance with an embodiment in the first aspect of the invention.

FIG. 1 shows an IC memory card power supply control circuit capable of battery backup in accordance with Embodiment 1 in the first aspect of the present invention. Components of this embodiment identical or corresponding to those of the above-described conventional power supply control circuit are designated by the same reference characters and the description for them will not be repeated. An external power supply voltage $V_{cc}$ from an external unit (not shown) applied between an external power supply voltage terminal 1 and a ground terminal 2 is divided into three voltages by voltage dividing resistors 3a, 3b, 3c, and 3d connected in series, and the divided voltages are supplied to inverting input terminals of comparators 4a, 4b, and 4c for detecting memory protection voltages. Also, the external voltage is separately divided by voltage dividing resistors 3e and 3f to be supplied to an inverting input terminal of a comparator 5 for detecting a voltage supply changing voltage. Each of these comparators 4a, 4b, 4c, and 5 is a comparator having a hysteresis such as that of the comparators of the conventional power supply control circuit. Also, reference voltages from a reference voltage generation circuit 6 are supplied to non-inverting input terminals of these comparators. Outputs from the memory protection voltage detection comparators 4a, 4b to 4c are input to a memory protection signal generation circuit 7, which outputs a memory protection signal through a memory protection signal output terminal 8. For example, in this embodiment, the memory protection signal serves to protect an internal circuit when set to high level and to allow accessing to the internal circuit when set to low level.

Figure 2:
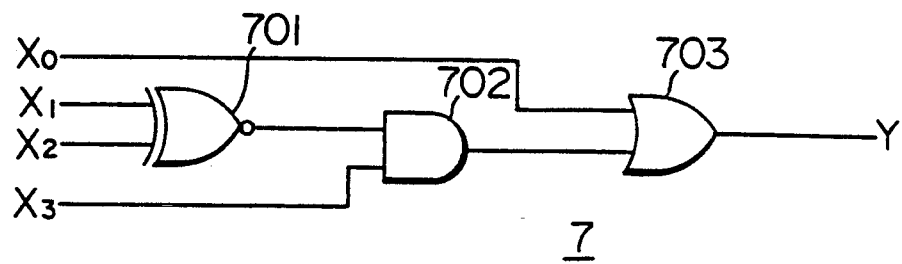
FIG. 2 is a logical circuit diagram showing an example of the configuration of the memory protection signal generation circuit shown in FIG. 1.

FIG. 2 shows an example of the logical arrangement of the memory protection signal generation circuit 7 shown in FIG. 1. Outputs $X_1$ and $X_2$ from comparators 4a and 4b are input to an exclusive NOR gate 701, and an output from the exclusive NOR gate 701 and an output $X_8$ from the comparator 4c are input to an AND gate 702. An output $X_0$ from the comparator 5 and an output from the AND gate 702 are input to an OR gate 703. An output Y from the OR gate 703 is output as a memory protection signal. The configuration of the memory protection signal generation circuit 7 is not limited to this.

In this embodiment, a power supply voltage detection means is formed of the voltage dividing resistors 3a to 3f, the memory protection voltage detection comparators 4a, 4b, and 4c, the power supply changing voltage detection comparator 5 and the reference voltage generation circuit 6. A power supply changing means is formed of a power supply changing transistor 9. A protection control means is formed of the memory protection signal generation circuit 7.

In this embodiment, two voltage dividing circuits, i.e., the circuit for forming the protection signal, formed of resistors 3a to 3d, and the circuit for power supply changing, formed of resistors 3e and 3f are provided. However, only one voltage dividing circuit may be used so long as voltages at the desired dividing ratios can be obtained. The same can be said with respect to the embodiments described later.

The operation of the battery backup circuit shown in FIG. 1 will be described. In a situation where no voltage is applied between the external power supply voltage terminal 1 and the ground terminal 2, storage of data in the IC memory card is backed up by the voltage of a backup battery (not shown) connected to the battery connection terminal 11. That is, the transistor 9 is in the off state and the battery voltage is supplied to the internal voltage output terminal 10 through the Schottky diode 12 and the current limiting diode 13. Also, in this situation, all the outputs from the comparators 4a, 4b, 4c, and 5 are high level and, therefore, the output Y from the OR gate 703 of the memory protection signal generation circuit 7 is high level and the high level memory protection signal is output through the terminal 8. Accordingly, the internal circuit is in a protected state.

If the external voltage $V_{cc}$ rises and becomes equal to a power supply changing voltage $V_{s1}(+)$, the output $X_0$ from the power supply changing voltage detection comparator 5 is inverted to low level to turn on the transistor 9, and the external power supply voltage $V_{cc}$ is supplied to the internal voltage output terminal 10 through the transistor 9. The internal circuit is thereby set in a non-accessible state such that stored data is protected although the external power supply voltage is supplied, i.e., a standby state (protected state). If the external voltage $V_{cc}$ rises further and becomes equal to a lower limit voltage $V_{s2}(+)$ of a lower operation-ensured voltage range, the output $X_1$ from the comparator 4a is inverted to low level and the output from the exclusive NOR gate 701 of the memory protection signal generation circuit 7 becomes low level, whereby the output Y from the OR gate 703 is set to low level. Accordingly, the memory protection signal becomes low level, the internal circuit is temporarily released from the protected state, and the resulting state is such that a memory device in the internal circuit can be accessed in the lower operation-ensured voltage range ($V_{cc}=3.3$ V). If the external voltage $V_{cc}$ rises further and becomes equal to an upper limit voltage $V_{s3}(+)$ of the lower operation-ensured voltage range, the output $X_2$ from the comparator 4b is also inverted to low level and the output from the exclusive NOR gate 701 of the memory protection signal generation circuit 7 becomes high level, whereby the output Y from the OR gate 703 is set to high level. Accordingly, the memory protection signal becomes high level and the internal circuit is set in the protected state again, i.e., the standby state. If the external voltage $V_{cc}$ rises further and becomes equal to a lower limit voltage $V_{s4}(+)$ of a higher operation-ensured voltage range ($V_{cc}=5$ V), the output $X_3$ from the comparator 4c is also inverted to low level and all the outputs from the comparators 4a, 4b, 4c, and 5 become low level. Accordingly, the memory protection signal becomes low level again, the internal circuit is released from the protected state and the resulting state is such that the internal circuit, i.e., the memories can be accessed in the higher operation-ensured voltage range ($V_{cc}=5$ V).

In the case of dropping of the external power supply voltage, as voltages $V_{s4}(-)$, $V_{s3}(-)$ and $V_{s2}(-)$ corresponding to the limit voltages in the case of voltage rising are successively reached, the outputs from the comparators 4c, 4b, and 4a are successively inverted to high level in the order reverse to the above-described order. When the voltage $V_{cc}$ is between a lower limit voltage of a higher operation-ensured voltage range and an upper limit voltage of a lower operation-ensured voltage range and when it is below a lower limit voltage of the lower operation-ensured voltage range, the memory protection signal is high level and the internal circuit is set in the protected state. If the power supply voltage $V_{cc}$ drops further and becomes equal to a power supply changing voltage $V_{s1}(-)$ in the voltage dropping state, the output from the comparator 5 is inverted to high level to turn off the PMOS transistor 9. The internal circuit is thereby set in the state of being backed up by the battery.

The operating ensuring higher-voltage (5 V) and lower-voltage (3.3 V) ranges are, for example, the range of 5 V±5%, i.e., 4.75 to 5.25 V (higher-voltage range), and the range of 3.3 V±50, i.e., 3.135 to 3.465 V (lower-voltage range), as mentioned above. However, the above-described lower-limit voltage $V_{s2}(+)$ and upper limit voltage $V_{s8}(+)$ of the lower operation-ensured voltage range, the lower limit voltage $V_{s4}(+)$ of the higher operation-ensured voltage range, and the voltages in the voltage dropping state corresponding to these voltages are not accurately adjusted to such voltage ranges; they are set with certain margins and vary with respect to voltage rising and voltage dropping. The following are examples of the limit voltages.

| External voltage rising state | External voltage dropping state |
|---|---|
| $V_{s1}(+) = 2.8$ V | $V_{s1}(-) = 2.7$ V |
| $V_{s2}(+) = 3.0$ V | $V_{s2}(-) = 2.9$ V |
| $V_{s3}(+) = 3.6$ V | $V_{s3}(-) = 3.5$ V |
| $V_{s4}(+) = 4.7$ V | $V_{s4}(-) = 4.6$ V |

These voltages can be adjusted to the desired values by changing the voltage dividing resistors and the reference voltages from the reference voltage generation circuit. The operation-ensured voltage ranges are not limited to 3.3 V and 5 V ranges.

[Embodiment 2]

In the above-described embodiment, the input voltages to the memory protection voltage detection comparators 4a, 4b, and 4c are formed by voltage dividing using four voltage dividing resistors 3a to 3d. In Embodiment 2 shown in FIG. 3, modified from the first embodiment, constant-voltage power sources 14a and 14b are connected between the non-inverting input terminals of the comparators 4a to 4c to which the reference voltage is applied to divide the reference voltage into three levels, and a common voltage divided by voltage dividing resistors 3a and 3b is used as the input for monitoring the power supply voltage. That is, in the first embodiment, a common reference voltage is used while the input for monitoring the power supply voltage is varied in a stepping manner with respect to the comparators by using voltage dividing resistors. In contrast, in the second embodiment, a common input for monitoring the power supply voltage is used while the reference voltage is varied in a stepping manner with respect to the comparators by the constant-voltage power sources.

Figure 3:
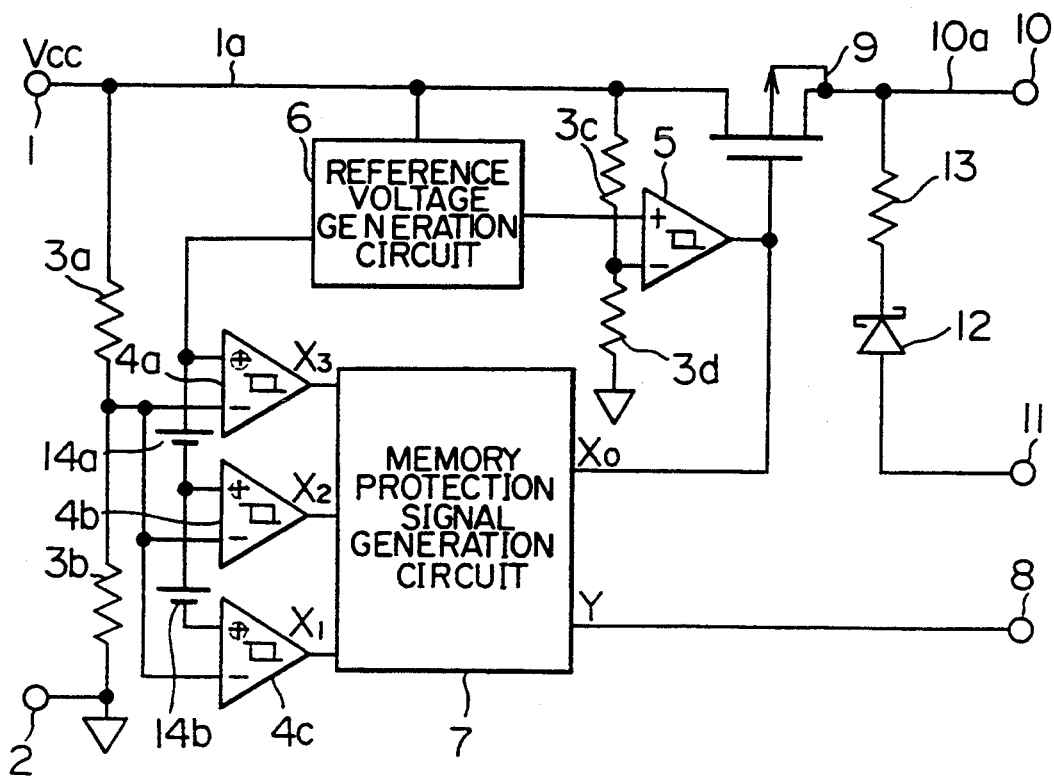
FIG. 3 is a diagram of an IC memory card power supply control circuit in accordance with another embodiment in the first aspect of the invention.

The memory protection signal generation circuit 7 of Embodiment 2 shown in FIG. 3 has the same configuration as that of Embodiment 1 shown in FIG. 2. In Embodiment 2, the comparators are inverted in the order of 4c, 4b and 4a when the external voltage $V_{cc}$ rises. Accordingly, the outputs from the comparators 4a, 4b, and 4c are outputs $X_3$, $X_2$, and $X_1$, respectively, as shown in FIG. 3. These voltages correspond to $X_1$, $X_2$, and $X_3$ shown in FIG. 2.

The operation of this embodiment will be described briefly. If the external voltage $V_{cc}$ rises and becomes equal to the voltage $V_{s1}(+)$, the output $X_0$ from the power supply changing voltage detection comparator 5 is inverted to turn on the transistor 9, and the external power supply voltage $V_{cc}$ is supplied to the internal voltage output terminal 10 through the transistor 9. If the external voltage $V_{cc}$ rises further and becomes equal to the voltage $V_{s2}(+)$, the output $X_1$ from the comparator 4c is inverted to low level and the memory protection signal becomes low level, as in the case of the first embodiment. The internal circuit is temporarily released from the protected state thereby, and the resulting state is such that a memory device in the internal circuit can be accessed in the lower operation-ensured voltage range ($V_{cc}=3.3$ V). If the external voltage $V_{cc}$ rises further and becomes equal to the upper limit voltage $V_{s3}(+)$ of the lower operation-ensured voltage range, the output $X_2$ from the comparator 4b is also inverted to low level and the output from the exclusive NOR gate 701 becomes high level, whereby the output Y from the OR gate 703 is set to high level. Accordingly, the memory protection signal becomes high level and the internal circuit is set in the protected state again. If the external voltage $V_{cc}$ rises further and becomes equal to the lower limit voltage $V_{s4}(+)$ of the higher operation-ensured voltage range ($V_{cc}=5$ V), the output $X_3$ from the comparator 4a is also inverted to low level and all the outputs from the comparators 4a, 4b, 4c, and 5 become low level. Accordingly, the memory protection signal becomes low level again, the internal circuit is released from the protected state, and the resulting state is such that the memories can be accessed in the higher operation-ensured voltage range ($V_{cc}=5$ V).

In the case of dropping of the external power supply voltage, as the voltages $V_{s4}(-)$, $V_{s3}(-)$ and $V_{s2}(-)$ are successively reached, the outputs from the comparators 4a, 4b, and 4c are successively inverted to high level in the order reverse to the above-described order. When the voltage $V_{cc}$ is between the lower limit voltage of the higher operation-ensured voltage range and the upper limit voltage of the lower operation-ensured voltage range and when it is below the lower limit voltage of the lower operation-ensured voltage range, the memory protection signal is high level and the internal circuit is set in the protected state. If the power supply voltage $V_{cc}$ drops further and becomes equal to the power supply changing voltage $V_{s1}(-)$ in the voltage dropping state, the output from the comparator 5 is inverted to high level to turn off the PMOS transistor 9. The internal circuit is thereby set in the state of being backed up by the battery.

[Embodiment 3]

Figure 4:
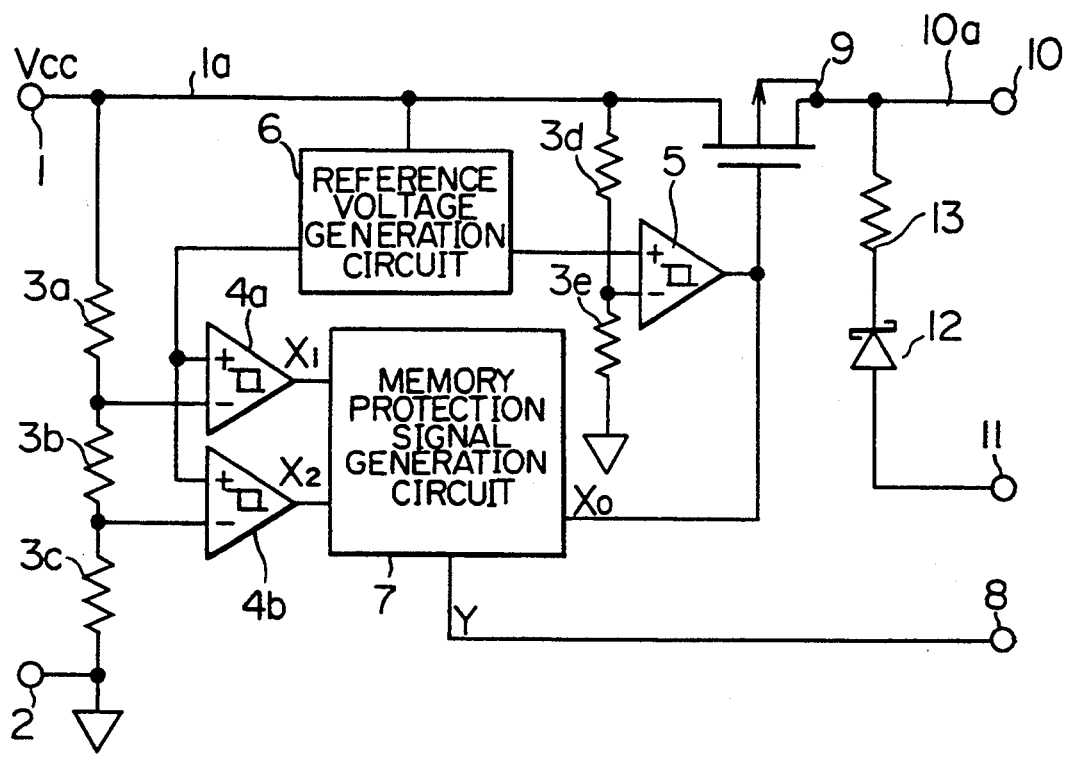
FIG. 4 is a diagram of an IC memory card power supply control circuit in accordance with a further embodiment in the first aspect of the invention.

In the above-described embodiments, the memory protection voltage detection comparators 4a, 4b, 4c, and 5 are provided separately. However, the power supply control circuit may be arranged in such a manner that the power supply changing voltage detection comparator 5 has a memory protection voltage detection function and the number of memory protection voltage detection comparators is reduced by 1, as shown in FIG. 4. In this embodiment, if the external power supply voltage $V_{cc}$ rises and becomes equal to or higher than the lower limit voltage of the lower operation-ensured voltage range, the power supply voltage is changed from the battery voltage to the external power supply voltage $V_{cc}$, and the internal circuit is released from the protected state.

In Embodiment 3 shown in FIG. 4, the external power supply voltage $V_{cc}$ applied between the external power supply voltage terminal 1 and the ground terminal 2 is divided into two voltages by voltage dividing resistors 3a, 3b, and 3c connected in series, and the divided voltages are respectively supplied to the inverting input terminals of memory protection voltage detection comparators 4a and 4b. Also, the external voltage $V_{cc}$ is separately divided by voltage dividing resistors 3d and 3e to be supplied to the inverting input terminal of the power supply changing voltage detection comparator 5. Also, reference voltages from the reference voltage generation circuit 6 are supplied to the non-inverting input terminals of these comparators.

Figure 5:
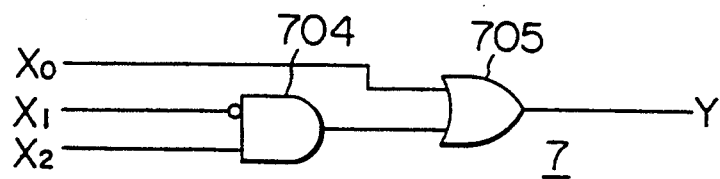
FIG. 5 is a logical circuit diagram showing an example of the configuration of the memory protection signal generation circuit shown in FIG. 4.

FIG. 5 shows an example of the logical arrangement of the memory protection signal generation circuit 7 shown in FIG. 4. Outputs $X_1$ and $X_2$ from comparators 4a and 4b are input to an AND gate 704. The output $X_1$ from the comparator 4a is input by being inverted. An output from the AND gate 704 and output XO from the power supply changing voltage detection comparator 5 are input to an OR gate 705. Output Y from the OR gate 705 is obtained as a memory protection signal. The configuration of the memory protection signal generation circuit 7 is not limited to this.

The operation of Embodiment 3 shown in FIG. 4 will be described briefly. If the external voltage $V_{cc}$ rises and becomes equal to the lower limit voltage $V_{s2}(+)$ of the lower operation-ensured voltage range described with respect to Embodiment 1, the output $X_0$ from the power supply changing voltage detection comparator 5 is inverted to low level to turn on the transistor 9, and the external power supply voltage $V_{cc}$ is supplied to the internal voltage output terminal 10 through the transistor 9. Simultaneously, the input to the OR gate of the memory protection signal generation circuit 7 is also set to low level and the output Y becomes low level. Accordingly, the memory protection signal becomes low level, the internal circuit is temporarily released from the protected state, and the resulting state is such that a memory device in the internal circuit can be accessed at the lower voltage ($V_{cc}=3.3$ V). If the external voltage $V_{cc}$ rises further and becomes equal to the upper limit voltage $V_{s3}(+)$ of the lower operation-ensured voltage range, the output $X1$ from the comparator 4a is inverted to low level and the output from the AND gate 704 becomes high level, whereby the output Y from the OR gate 705 is set to high level. Accordingly, the memory protection signal becomes high level and the internal circuit is set in the protected state again. If the external voltage $V_{cc}$ rises further and becomes equal to the lower limit voltage $V_{s4}(+)$ of the higher operation-ensured voltage range ($V_{cc}=5$ V), the output $X_2$ from the comparator 4b is also inverted to low level and all the outputs from the comparators 4a, 4b, and 5 become low level. Accordingly, the memory protection signal becomes low level again, the internal circuit is released from the protected state, and the resulting state is such that the memories can be accessed in the higher operation-ensured voltage range ($V_{cc}=5$ V).

In the case of dropping of the external power supply voltage, as the voltages $V_{s4}(-)$, $V_{s3}(-)$ and $V_{s2}(-)$ are successively reached, the outputs from the comparators 4b, 4a, and 5 are successively inverted to high level in the order reverse to the above-described order. When the voltage $V_{cc}$ is between the lower limit voltage of the higher operation-ensured voltage range and the upper limit voltage of the lower operation-ensured voltage range and when it is below the lower limit voltage of the lower operation-ensured voltage range, the memory protection signal is high level and the internal circuit is set in the protected state. If the power supply voltage $V_{cc}$ drops further and becomes equal to the voltage $V_{s2}(-)$ and if the output from the comparator 5 is thereby inverted to high level, the PMOS transistor 9 is simultaneously turned off and the internal circuit is thereby set in the state of being backed up by the battery.

[Embodiment 4]

Figure 6:
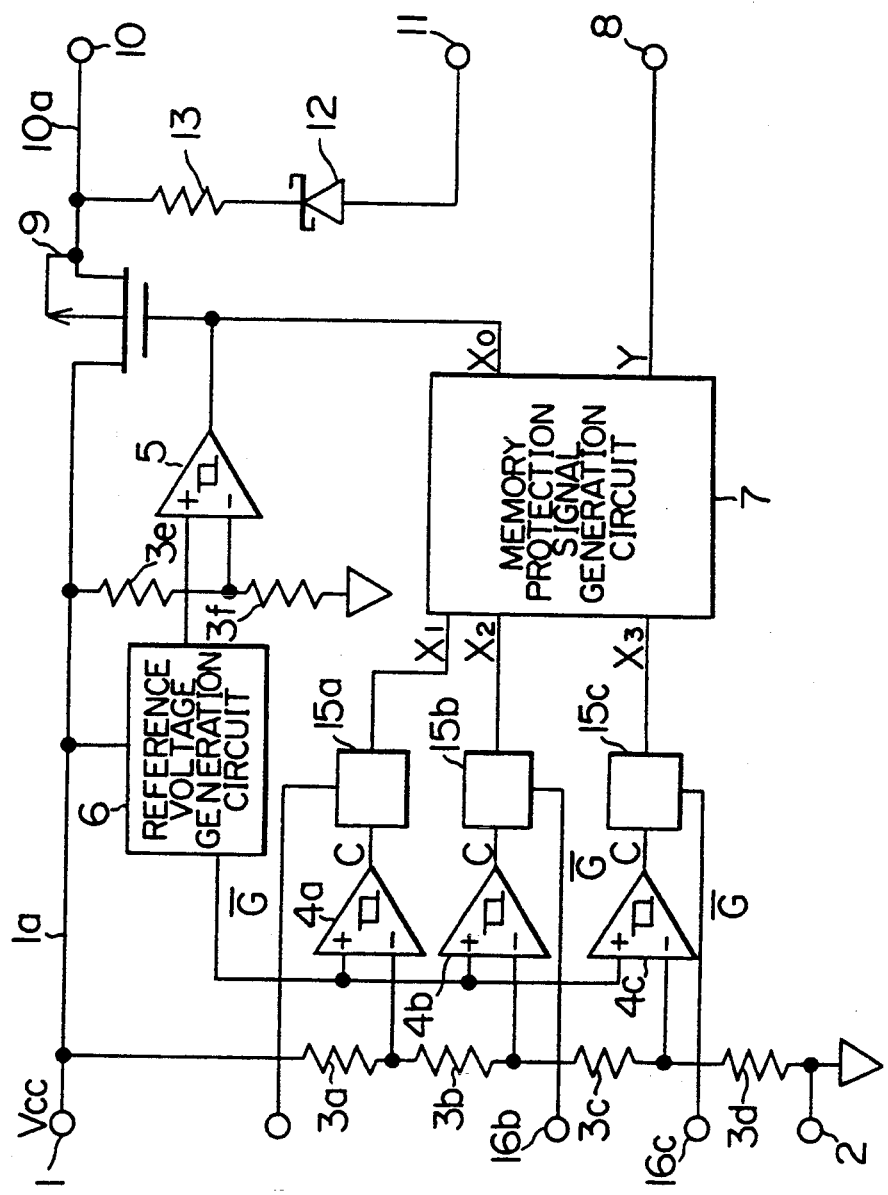
FIG. 6 is a diagram of an IC memory card power supply control circuit in accordance with an embodiment in the second aspect of the invention.
Figure 7:
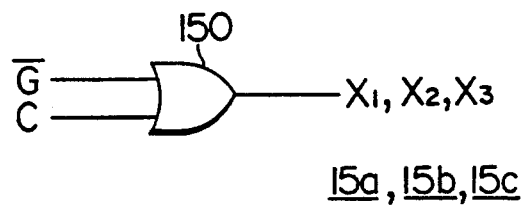
FIG. 7 is a logical circuit diagram showing an example of the configuration of the comparator output effectivity/noneffectivity control circuit shown in FIG. 6.

FIG. 6 shows a power supply control circuit in accordance with Embodiment 4 in the second aspect of the present invention. In accordance with the invention in the second aspect voltage levels detected by a power supply voltage detection means are selectively made ineffective to enable the same power supply control circuit to be used for each of a single power supply voltage operation system for operation at one of two operation-ensured voltages (having an operation-ensured voltage range at 3.3 V or 5 V), a dual power supply voltage operation system (having operation-ensured voltage ranges at 3.3 V and 5.5 V) and a wide-range power supply voltage operation system (having an operation-ensured voltage range through a wide range of 3.3 to 5 V). The circuit configuration of this embodiment is the same as that of Embodiment 1 shown in FIG. 1 except that comparator output effectivity/non-effectivity control circuits 15a, 15b, and 15c are provided on the output side of memory protection voltage detection comparators 4a, 4b, and 4c, respectively, as operating range changing means, and control terminals 16a, 16b, and 16c are provided for these control circuits, whereby the effectivity/non-effectivity of outputs from the comparators can be controlled independently from the outside. The comparator output effectivity/non-effectivity control circuits 15a, 15b, and 15c are identical in configuration and are each formed of, for example, an OR gate 150 for controlling the output C from the comparator by a control signal G from the control terminal 16, as shown in FIG. 7. The configuration of memory protection signal generation circuit 7 may be the same as, for example, that of Embodiment 1 shown in FIG. 2.

The basic operation of the battery backup circuit in accordance with this embodiment is the same as that of Embodiment 1. To perform the operation in accordance with the same two power supply voltage operation system as that of Embodiment 1, i.e., the operation enabling the internal circuit to be accessed in each of two separate operation-ensured voltage ranges, i.e., a higher-voltage (5 V) range and a lower-voltage range (3.3 V), a low level control signal is supplied to all the control terminals 16a, 16b, and 16c. The output from each of the comparators 4a, 4b, and 4c is thereby supplied directly to the memory protection signal generation circuit 7, thereby performing the same operation as Embodiment 1.

To perform the operation enabling the internal circuit to be accessed only in the lower operation-ensured voltage (3.3 V) range, a high level control signal is supplied to the control terminal 16c to constantly set an output $X_8$ from the control circuit 15c to high level, thereby making the output from the comparator 4c ineffective. To perform the operation enabling the internal circuit to be accessed only in the higher operation-ensured voltage (5 V) range, the high level control signal is supplied to each of the control terminals 16a and 16b to constantly set outputs $X_1$ and $X_2$ from the control circuits 15a and 15b to high level, thereby making the outputs from the comparators 4a and 4b ineffective. To perform the operation enabling the internal circuit to be accessed in the wide operation-ensured voltage from the lower voltage (3.3 V) to the higher voltage (5.5 V), the high level control signal is supplied to the control terminal 16b to constantly set output $X_2$ from the control circuit 15b to high level, thereby making the output from the comparator 4b ineffective. In this case, the same effect can also be achieved by applying the high level control signal to both the control terminals 16b and 16c. In this manner, the power supply control circuit can be applied to each of the two single power supply voltage operation system, the dual power supply voltage operation system and the wide-range power supply voltage operation system.

[Embodiment 5]

Figure 8:
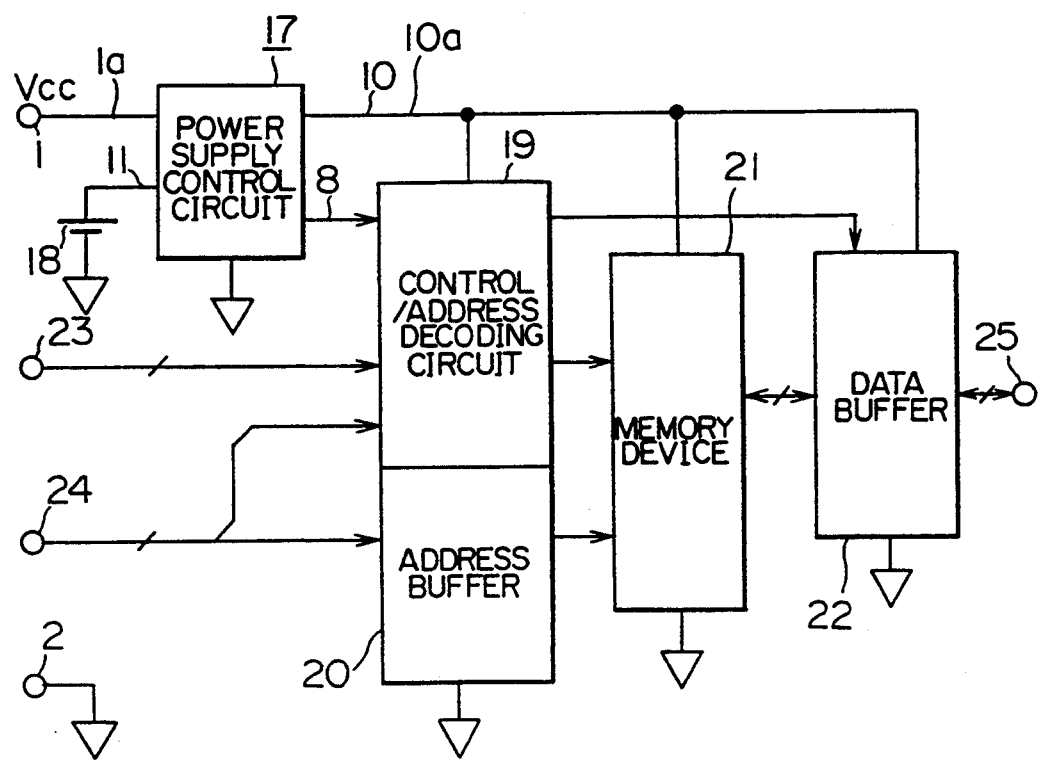
FIG. 8 is a diagram of an IC memory card having a power supply control circuit in accordance with the first aspect of the invention.

FIG. 8 is a block diagram of the whole of an IC memory card capable of battery backup and provided with a power supply control circuit 17 provided in the first aspect of the present invention. As shown in FIG. 8, the memory card has a backup battery 18, a control/address decoding circuit 19, an address buffer 20, a memory device 21, a data buffer 22, a control input terminal 23 through which a card enable signal or the like, for example, is input, an address input terminal 24, and a data input/output terminal 25.

The operation of this memory card will be described below. In the state of being backed up by the battery 18, the voltage of the battery 18 is output through the internal voltage output terminal 10 of the power supply control circuit 17 of the invention to back up the internal circuit. Also, at this time, the memory protection signal is output to the control/address decoding circuit 19 from the memory protection signal output terminal 8 of the power supply control circuit 17, thereby setting the memory device 21 in the protected and non-accessible state. If the external power supply voltage $V_{cc}$ applied between the external power supply terminal 1 and the ground terminal 2 rises and becomes equal to the power supply changing detection voltage $V_{s1}(+)$, the external power supply voltage $V_{cc}$ is output to the internal voltage output terminal 10 of the power supply control circuit 17. If the external power supply voltage $V_{cc}$ rises further and exceeds the lower limit voltage $V_{s2}(+)$ of the lower operation-ensured voltage range of the dual power supply voltage operation system, the supply of the memory protection signal from the power supply control circuit 17 is stopped and the memory device 21 can be accessed from the outside. If the external power supply voltage $V_{cc}$ rises further and exceeds the upper limit voltage $V_{s3}(+)$ of the lower operation-ensured voltage range, the memory protection signal is output again from the power supply control circuit 17 and the memory device 21 is set in the non-accessible state (standby state). If the external power supply voltage $V_{cc}$ rises further and exceeds the lower limit voltage $V_{s4}(+)$ of the higher operation-ensured voltage range of the dual power supply voltage operation system, the supply of the memory protection signal from the power supply control circuit 17 is stopped and the memory device 21 becomes accessible in the higher operation-ensured voltage range. At the time of power supply voltage dropping, the operation control circuit 17 operates in the order reverse to the above-described order so that the memory is reliably protected in the non-operation-ensured voltage ranges.

[Embodiment 6]

Figure 9:
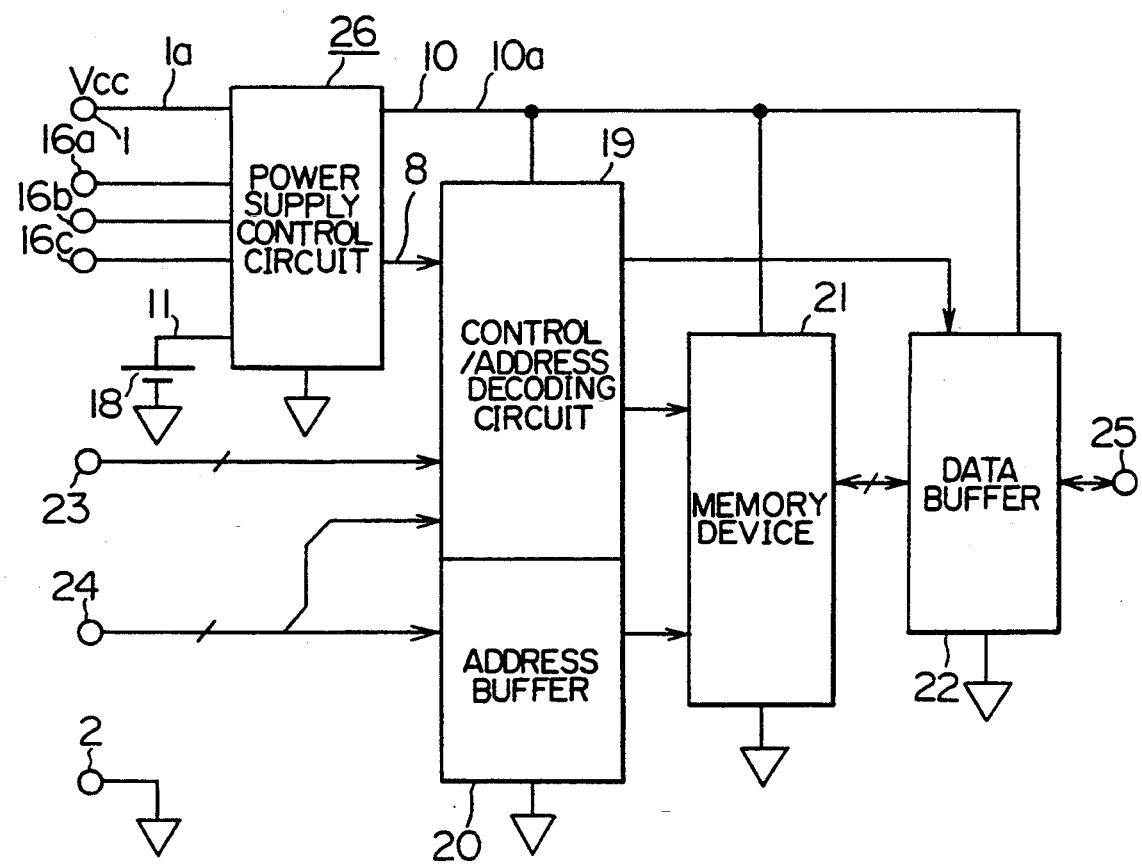
FIG. 9 is a diagram of an IC memory card having a power supply control circuit in accordance with the second aspect of the invention.
Figure 10:
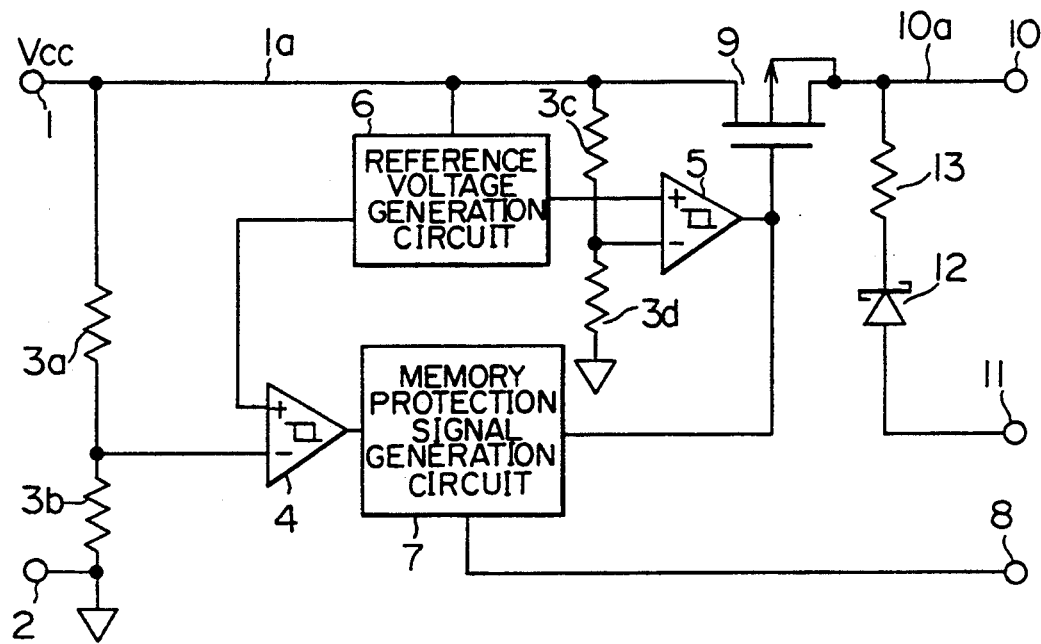
FIG. 10 is a diagram of a conventional IC memory card power supply control circuit having a backup function.

FIG. 9 is a block diagram of the whole of an IC memory card capable of battery backup and provided with a power supply control circuit 26 provided in the second aspect of the present invention. In the memory card shown in FIG. 9, terminals 16a, 16b, and 16c correspond to the control terminals of the comparator output effectivity/non-effectivity control circuits 15a, 15b, and 15c shown in FIG. 6. Through these control terminals 16a, 16b, and 16c, the detection signals output from the power supply voltage detection means with respect to the upper and lower limit voltages of the operation-ensured voltage ranges can be set so as to be effective or ineffective. It is therefore possible to operate this memory card in any of the dual power supply voltage operation system, the single low power supply voltage operation system, the single high power supply voltage operation system and the wide-range power supply voltage operation system.

According to the first aspect of the invention, in a power supply control circuit of an IC memory card capable of battery backup and used in a dual power supply voltage operation system having two operation-ensured voltage ranges, a memory can be reliably protected even in a non-operation-ensured voltage ranges between the two operation-ensured voltage ranges, as described above. It is thereby possible to prevent destruction of internal data due to an erroneous access to the data and to provide an IC memory card power supply control circuit having improved reliability.

According to the second aspect of the invention, it is possible to use the same power supply control circuit in each of the dual power supply voltage operation system, the two kinds of single power supply voltage operation system and the wide-range power supply voltage operation system by externally and independently controlling the power supply voltage detection signal relating to the two operation-ensured voltage ranges in the first aspect of the invention. The cost reduction effect achieved by using a common power supply control circuit for various IC cards in this manner is high.

What is claimed is:

1. A power control circuit for an IC memory card used in a dual voltage operation system having the operation-ensured voltage ranges which are higher and lower voltage ranges separate from each other, the memory card having a backup battery for an internal circuit, said power supply control circuit comprising:
    an external power supply line to which an external power source is detachably connected;
    an internal power supply line to which the internal circuit and the backup battery are connected;
    power supply voltage detection means for generating a plurality of output signals each signal being indicative of a voltage level within either one of the two operation-ensured voltage ranges and for generating a signal indicative or a power supply changing voltage;
    power supply changing means for connecting said external power supply line to said internal power supply based on the operation of said power supply voltage detection means when the voltage level of said external power supply line is equal to a predetermined voltage level before reaching each of the two operation-ensured voltage ranges; and
    protection control means for releasing the internal circuit from a protected state based on the operation of said power supply voltage detection means when the voltage level of said external power supply line is within one of the two operation-ensured voltage ranges.

2. A power supply control circuit according to claim 1 wherein said power supply voltage detection means includes a reference voltage generation circuit for generating a common reference voltage which is a comparison reference for detecting a state where the voltage level of said external power supply line is within one of the two operation-ensured voltage ranges, at least one voltage dividing circuit for dividing the voltage of said external power supply line into a plurality of levels, and a plurality of comparators each for comparing the corresponding one of the voltages divided by said voltage dividing circuit with the reference voltage to form an output indicating that the voltage level of said external power supply line has become equal to one of predetermined voltage levels which are set by considering the lower and upper limits of the lower one of the two operation-ensured voltage ranges and the lower limit of the higher one of the two operation-ensured voltage ranges;
    wherein said protection control means includes a protection signal generation circuit for supplying a signal to the internal circuit to release the internal circuit from the protected state based on the output from each of said comparators when the voltage level of said external power supply line is within one of the two operation-ensured voltage ranges; and
    wherein said power supply changing means connects said external power supply line to said internal power supply line when the voltage level of said external power supply line becomes equal to the voltage level set by considering the lower limit of the lower one of the two operation-ensured voltage ranges.

3. A power supply control circuit according to claim 1 wherein said power supply voltage detection means also detects a state where the voltage level of said external power supply line has become equal to a predetermined voltage level not higher than the lower limit of the lower one of the two operation-ensured voltage ranges, and includes a reference voltage generation circuit for generating a common reference voltage which is a comparison reference for detecting a state where the voltage level of said external power supply line is within one of the two operation-ensured voltage ranges or equal to the predetermined voltage level not higher than the lower limit of the lower one of the two operation-ensured voltage ranges, at least one voltage dividing circuit for dividing the voltage of said external power supply line into a plurality of voltages, and a plurality of comparators each for comparing the corresponding one of the voltages divided by said voltage dividing circuit with the reference voltage to form an output indicating that the voltage level of said external power supply line has become equal to one of predetermined voltage levels which are set by considering the lower and upper limits of the lower one of the two operation-ensured voltage ranges, the lower limit of the higher one of the two operation-ensured voltage ranges and the predetermined voltage level not higher than the lower limit of the lower voltage range;

wherein said protection control means includes a protection signal generation circuit for supplying a signal to the internal circuit to release the internal circuit from the protected state based on the output from each of said comparators when the voltage level of said external power supply line is within one of the two operation-ensured voltage ranges; and wherein said power supply changing means connects said external power supply line to said internal power supply line when the voltage level of said external power supply line becomes equal to the predetermined voltage level not higher than the lower limit of the lower one of the two operation-ensured voltage ranges.

4. A power supply control circuit according to claim 1 wherein said power supply voltage detection means also detects a state where the voltage level of said external power supply line has become equal to a predetermined voltage level not higher than the lower limit of the lower one of the two operation-ensured voltage ranges, and includes a reference voltage generation circuit for generating a plurality of different reference voltages which are comparison references each for detecting a state where the voltage level of said external power supply line is within one of the two operation-ensured voltage ranges or equal to the predetermined voltage level not higher than the lower limit of the lower one of the two operation-ensured voltage ranges, at least one voltage dividing circuit for dividing the voltage of said external power supply line into a plurality of voltages, and a plurality of comparators each for comparing the corresponding one of the voltages divided by said voltage dividing circuit with the corresponding one of the reference voltages to form an output indicating that the voltage level of said external power supply line has become equal to one of predetermined voltage levels which are set by considering the lower and upper limits of the lower one of the two operation-ensured voltage ranges, the lower limit of the higher one of the two operation-ensured voltage ranges and the predetermined voltage level not higher than the lower limit of the lower voltage range;

wherein said protection control means includes a protection signal generation circuit for supplying a signal to the internal circuit to release the internal circuit from the protected state based on the output from each of said comparators when the voltage level of said external power supply line is within one of the two operation-ensured voltage ranges; and wherein said power supply changing means connects said external power supply line to said internal power supply line when the voltage level of said external power supply line becomes equal to the predetermined voltage level hot higher than the lower limit of the lower one of the two operation-ensured voltage ranges.

5. A power supply control circuit according to claim 1 further comprising operating range changing means for changing operating ranges in accordance with a single power supply voltage operation system using the higher or lower one of the two operation-ensured voltage ranges, a dual power supply voltage operation system using the two operation-ensured voltage ranges, and a wide-range power supply voltage operation system having an operation-ensured voltage range covering the two operation-ensured voltage ranges by selectively making voltage levels detected by said power supply voltage detection means ineffective.

* * * * *